US009496845B2

(12) United States Patent
Chang et al.

(10) Patent No.: US 9,496,845 B2
(45) Date of Patent: Nov. 15, 2016

(54) COMMON MODE FILTER AND METHOD FOR MANUFACTURING THE SAME

(71) Applicant: Samsung Electro-Mechanics Co., Ltd., Suwon (KR)

(72) Inventors: Geon-Se Chang, Suwon (KR); Jin-Hyuck Yang, Suwon (KR); Jeong-Min Cho, Suwon (KR)

(73) Assignee: SAMSUNG ELECTRO-MECHANICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 14/451,026

(22) Filed: Aug. 4, 2014

(65) Prior Publication Data

US 2015/0303893 A1 Oct. 22, 2015

(30) Foreign Application Priority Data

Apr. 22, 2014 (KR) ........................ 10-2014-0048305

(51) Int. Cl.
| | |
|---|---|
| *H03H 7/09* | (2006.01) |
| *H03H 7/42* | (2006.01) |
| *H01F 27/28* | (2006.01) |
| *H01F 27/29* | (2006.01) |
| *H01F 27/24* | (2006.01) |
| *H01F 41/04* | (2006.01) |
| *H01F 41/02* | (2006.01) |
| *H03H 1/00* | (2006.01) |

(52) U.S. Cl.
CPC ............ *H03H 7/427* (2013.01); *H01F 27/24* (2013.01); *H01F 27/2804* (2013.01); *H01F 27/292* (2013.01); *H01F 41/0206* (2013.01); *H01F 41/041* (2013.01); *H03H 1/0007* (2013.01); *H03H 7/09* (2013.01); *H03H 2001/0085* (2013.01)

(58) Field of Classification Search
CPC ..................... H03H 2001/0085; H03H 7/427; H03H 1/0007; H01P 7/09
USPC ......................................... 333/175, 185, 181
See application file for complete search history.

(56) References Cited

U.S. PATENT DOCUMENTS

| | | | | |
|---|---|---|---|---|
| 2008/0266026 A1* | 10/2008 | Han | ...................... | H01P 1/2005 333/185 |
| 2014/0191824 A1* | 7/2014 | Yoshino | ................. | H03H 7/427 333/185 |

* cited by examiner

*Primary Examiner* — Robert Pascal
*Assistant Examiner* — Rakesh Patel
(74) *Attorney, Agent, or Firm* — McDermott Will & Emery LLP

(57) ABSTRACT

The present invention discloses a common mode filter and a method for manufacturing the common mode filter. The common mode filter in accordance with an embodiment of the present invention includes: a magnetic substrate; a first coil electrode formed on the magnetic substrate; a first lead electrode formed on the magnetic substrate; a first dielectric layer formed on the magnetic substrate; a height compensation electrode formed on the upper surface of the first lead electrode; a second coil electrode formed on the first dielectric layer; a second lead electrode formed on the first dielectric layer; a second dielectric layer formed on the first dielectric layer; and an external electrode formed on the second dielectric layer.

7 Claims, 5 Drawing Sheets

COMMON MODE FILTER AND METHOD FOR MANUFACTURING THE SAME

CROSS-REFERENCE TO RELATED APPLICATIONS

This application claims the benefit of Korean Patent Application No. 10-2014-0048305, filed with the Korean Intellectual Property Office on Apr. 22, 2014, the disclosure of which is incorporated herein by reference in its entirety.

BACKGROUND

1. Technical Field

The present invention relates to a common mode filter and a method of manufacturing the common mode filter.

2. Background Art

High-speed digital interfaces, such as USB, require a part that addresses noise. One of such parts that removes common mode noise selectively is a common mode filter.

Common mode noise can occur when impedance fails to be parallel in the wiring system. The common mode noise can occur more often for higher frequency. Since the common mode noise can be also transferred to, for example, the surface of the earth and bounced back with a big loop, the common mode noise causes various kinds of noise troubles in far-away electronic devices.

The common mode filter can allow a differential mode signal to bypass while selectively removing the common mode noise. In the common mode filter, magnetic flux is canceled out by the differential mode signal, causing no inductance to occur and allowing the differential mode signal to bypass. On the other hand, magnetic flux is augmented by the common mode noise, increasing the inductance and allowing the noise to be removed.

The related art of the present invention is disclosed in Korea Patent Publication No. 2011-0129844 (COMMON MODE NOISE FILTER; laid open on Dec. 6, 2011).

SUMMARY

The present invention provides a common mode filter and a manufacturing method thereof that can reduce a difference of height between a coil electrode and a lead electrode.

An aspect of the present invention provides a common mode filter, which includes: a magnetic substrate; a first coil electrode formed on the magnetic substrate; a first lead electrode formed on the magnetic substrate so as to be connected with an end of the first coil electrode; a first dielectric layer formed on the magnetic substrate so as to cover an upper surface of the first coil electrode and an upper surface of the first lead electrode; a height compensation electrode formed on the upper surface of the first lead electrode in order to compensate for a difference in height between the first dielectric layer and the first lead electrode; a second coil electrode formed on the first dielectric layer so as to be electrically connected with the first coil electrode; a second lead electrode formed on the first dielectric layer so as to be connected with an end of the second coil electrode and to be in contact with an upper surface of the height compensation electrode; a second dielectric layer formed on the first dielectric layer so as to cover an upper surface of the second coil electrode and an upper surface of the second lead electrode; and an external electrode formed on the second dielectric layer so as to be electrically connected with the second lead electrode.

The first dielectric layer can have a groove formed therein so as to allow the first lead electrode to be exposed, and the height compensation electrode can be formed in the groove.

The height compensation electrode and the second lead electrode can be integrally formed.

A cross-sectional area of the height compensation electrode can be smaller than that of the first lead electrode.

The second lead electrode can be positioned further inside than the first lead electrode.

The first lead electrode can be arranged near corners on the magnetic substrate.

The common mode filter can further include a magnetic layer formed on the second dielectric layer.

The common mode filter can further include a dielectric coating layer interposed between the magnetic substrate and the first dielectric layer.

Another aspect of the present invention provides a method for manufacturing a common mode filter, which includes: forming a first coil electrode on a magnetic substrate; forming a first lead electrode on the magnetic substrate, the first lead electrode being connected with an end of the first coil electrode; forming a first dielectric layer covering an upper surface of the first coil electrode and an upper surface of the first lead electrode; forming a groove in the first dielectric layer so as to allow the first lead electrode to be exposed; forming a second coil electrode on the first dielectric layer, the second coil electrode being electrically connected with the first coil electrode; forming a height compensation electrode in the groove in order to compensate for difference in height between the first dielectric layer and the first lead electrode; forming a second lead electrode on the first dielectric layer, the second lead electrode being connected with an end of the second coil electrode and being in contact with an upper surface of the height compensation electrode; forming a second dielectric layer on the first dielectric layer, the second dielectric layer covering an upper surface of the second coil electrode and an upper surface of the second lead electrode; and forming an external electrode on the second dielectric layer, the external electrode being electrically connected with the second lead electrode.

The second lead electrode is formed simultaneously with the height compensation electrode.

The step of forming the height compensation electrode and the second lead electrode can include: forming a resist in the groove and on the first dielectric layer; forming an opening configured to expose an inside of the groove and a portion of the first dielectric layer corresponding to positions of the height compensation electrode and the second lead electrode; forming a conductive layer in the opening; and removing the resist.

The method can further include forming a seed layer, prior to the step of forming the resist, and in the step of forming the conductive layer, the conductive layer can be formed by plating the seed layer.

The method can further include removing the seed layer that is exposed, after the step of removing the resist.

The second lead electrode and the height compensation electrode can be formed simultaneously with the second coil electrode.

In the step of forming the height compensation electrode, a cross-sectional area of the height compensation electrode can be smaller than that of the first lead electrode.

In the step of forming the second lead electrode, the second lead electrode can be formed further inside than the first lead electrode.

In the step of forming the first lead electrode, the first lead electrode can be formed near corners on the magnetic substrate.

The method can further include forming a magnetic layer on the second dielectric layer, after the step of forming the external electrode.

The step of forming the first coil electrode can include: forming a dielectric coating layer on the magnetic substrate; and forming the first coil electrode on the dielectric coating layer.

DETAILED DESCRIPTION

Figure 1:
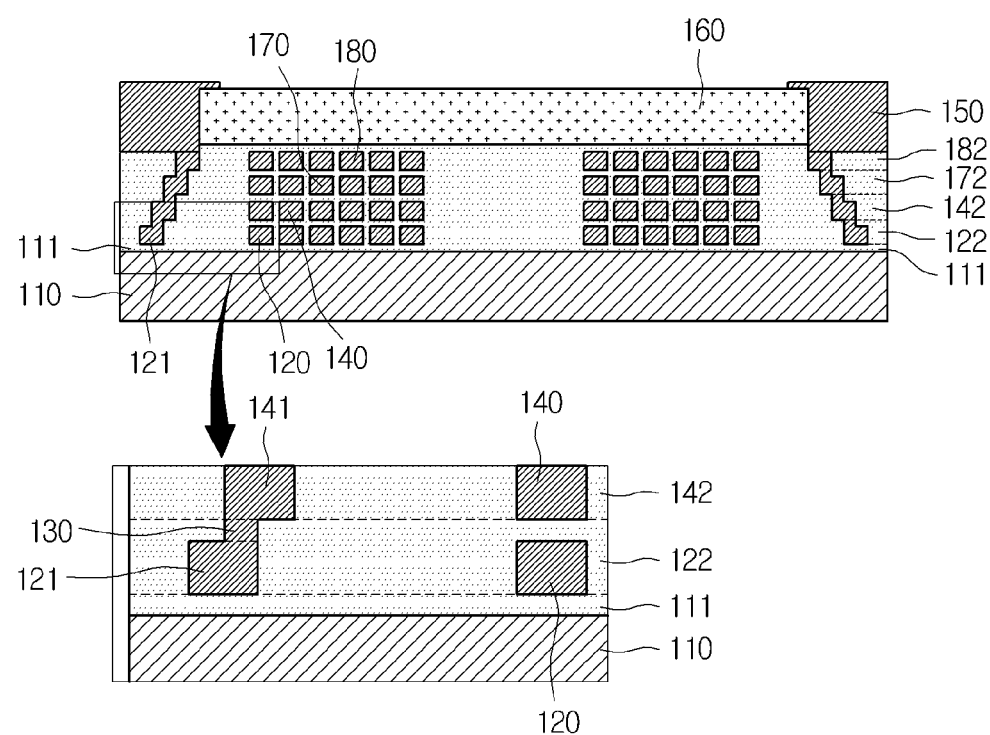
FIG. 1 shows a common mode filter in accordance with an embodiment of the present invention.

Hereinafter, certain embodiments of a common mode filter and a manufacturing method thereof in accordance with the present invention will be described in detail with reference to the accompanying drawings. In describing the present invention with reference to the accompanying drawings, any identical or corresponding elements will be assigned with same reference numerals, and no redundant description thereof will be provided.

Terms such as "first" and "second" can be used in merely distinguishing one element from other identical or corresponding elements, but the above elements shall not be restricted to the above terms.

When one element is described to be "coupled" to another element, it does not refer to a physical, direct contact between these elements only, but it shall also include the possibility of yet another element being interposed between these elements and each of these elements being in contact with said yet another element.

FIG. 1 shows a common mode filter in accordance with an embodiment of the present invention.

Referring to FIG. 1, a common mode filter 100 in accordance with an embodiment of the present invention can include a magnetic substrate 110, a first coil electrode 120, a first lead electrode 121, a first dielectric layer 122, a height compensation electrode 130, a second coil electrode 140, a second lead electrode 141, a second dielectric layer 142 and an external electrode 150, and can further include a magnetic layer 160 and a dielectric coating layer 111.

The magnetic substrate 110 is a board that is magnetic and is placed at a lowermost location of the common mode filter 100. The magnetic substrate 110 can include ferrite.

The magnetic substrate 110 can have the dielectric coating layer 111 formed thereon. The dielectric coating layer 111 can be formed by coating a dielectric material. The dielectric coating layer 111 can insulate the magnetic substrate 110 from the first coil electrode 120 (or the first lead electrode 121). Used as a material for the dielectric coating layer 111 can be polymer resin, such as epoxy resin or polyimide resin, which is highly workable and has a good electrical insulating property.

The first coil electrode 120 functions as an inductor. The first coil electrode 120 can be formed on the dielectric coating layer 111 of the magnetic substrate 110 with a conductive material such as copper (Cu) or aluminum (Al), which is highly conductive and workable, and can be constituted with two conductive lines.

The two conductive lines can be arranged to be parallel to each other and to form a helix. When electric current flows though the two conductive lines, magnetic coupling of magnetic fields occurring on the conductive lines can allow differential mode signals to bypass and common mode noises to be shielded.

One end of the first coil electrode 120 can be directly connected with the first lead electrode 121, and the other end of the first coil electrode 120 can be placed at a middle portion on an upper surface of the dielectric coating layer 111.

The first lead electrode 12 is formed on the dielectric coating layer 111 and functions to electrically connect the first coil electrode 120 with the external electrode 150. The first lead electrode 121 can be made of the same conductive material as that of the first coil electrode 120 and can be formed at the time of forming the first coil electrode 120.

The first lead electrode 121 can be constituted with four electrodes. In the case where the first coil 120 is constituted with two conductive lines, two of the four electrodes of the first lead electrode 121 can be connected, respectively, with the conductive lines of the first coil electrode 120.

The first lead electrode 121 can be placed near corners on the upper surface of the dielectric coating layer 111. As the first lead electrode 121 is placed near the corners on the upper surface of the dielectric coating layer 111, the area in which the first coil electrode 120 can be formed becomes relatively larger, and thus the number of turns of the helical first coil electrode 120 is increased, making it possible to efficiently remove the common mode noise.

The first lead electrode 121 can be formed in the shape of a rectangle, and a length of at least one side of the rectangle can be greater than a width of one conductive line of the first coil electrode 120.

The first dielectric layer 122 can be formed on the dielectric coating layer 111 so as to cover an upper surface of the first coil electrode 120 and an upper surface of the first lead electrode 121. The first dielectric layer 122 functions to insulate the first coil electrode 120 from the second coil electrode 140 and can be made of a photosensitive dielectric material.

Since the first dielectric layer 122 covers the upper surface of the first lead electrode 121, a height (thickness) of the first dielectric layer 122 is greater than a height (thickness) of the first lead electrode 121. In other words, a difference in height occurs between the first dielectric layer 122 and the first lead electrode 121.

The height compensation electrode 130 is for compensating for a difference in height between the first dielectric layer 122 and the first lead electrode 121 and can be made of the same conductive material as that of the first lead electrode 121.

The height compensation electrode 130 can be formed within a groove 131 that is formed in the first dielectric layer 122, so as to have the first lead electrode 121 exposed. In the case where the first dielectric layer 122 made of a photosensitive dielectric material is used, a portion of the first dielectric layer 122 corresponding to a position of the groove 131 can be removed through exposure and development procedures.

A depth of the groove 131 can be identical to the difference in height between the first dielectric layer 122 and the first lead electrode 121, and an area of the groove 131 can be identical to or smaller than that of the first dielectric layer 121. With the groove 131 having a smaller area than that of the first lead electrode 121, it becomes possible to save the costs for conductive material for forming the height compensation electrode 130. Meanwhile, the height compensation electrode 130 is formed to have a same thickness as the depth of the groove 131.

The second coil electrode 140 is formed on the first dielectric layer 122 so as to be electrically connected with the first coil electrode 120. The first coil electrode 120 and the second coil electrode 140 can be connected with each other through a via that penetrates the first dielectric layer 122, and the via can be formed corresponding to a middle portion of the first dielectric layer 122 where the end of the first coil electrode 12 is placed.

Like the first coil electrode 120, the second coil electrode 140 can be constituted with two conductive lines, which can be helically arranged to be parallel to each other. Here, one end of the second coil electrode 140 is directly connected with the via formed in the first dielectric layer 122, and the other end thereof is directly connected with the second lead electrode 141.

With the first coil electrode 120 and the second coil electrode 140, the overall coil electrodes can have an extended length, and accordingly the effect of inductance becomes greater, enhancing the ability to remove the common mode noise.

The second lead electrode 141 connects the second coil electrode 140 to the external electrode 150 and can be made of the same conductive material as that of the first lead electrode 121. The second lead electrode 141 is directly connected with the end of the second coil electrode 140 and is formed on the first dielectric layer 122 so as to be in contact with an upper surface of the height compensation electrode 130. The second lead electrode 141 can be electrically connected with the first lead electrode 121 by way of the height compensation electrode 130. Moreover, the second lead electrode 141 can be formed to maintain a same height as the second coil electrode 140 by the height compensation electrode 130.

As illustrated in FIG. 1, the second lead electrode 141 is formed on an upper surface of the first dielectric layer 122 as well as the upper surface of the height compensation electrode 130. That is, the second lead electrode 141 is formed on both the height compensation electrode 130 and the first dielectric layer 122. In such a case, since the height compensation electrode 130 and the second lead electrode 141 can be formed integrally and simultaneously, the manufacturing process can be simplified.

If there were no height compensation electrode 130, the second lead electrode 141 would be formed directly on the first lead electrode 121 while the second coil electrode 140 would be formed on the first dielectric layer 122, and thus a positional difference (difference in height of upper-most ends) between the second lead electrode 141 and the second coil electrode 140. In other words, the second lead electrode 141 would be positioned to be lower than the second coil electrode 140. In such a case, the second lead electrode 141 and the second coil electrode 140 may be possibly short-circuited while the second lead electrode 141 and the second coil electrode 140 are formed.

However, by providing the height compensation electrode 130, the second lead electrode 141 and the second coil electrode 140 can be formed at a same height, thereby preventing short-circuit.

Like the first lead electrode 121, the second lead electrode 141 can be constituted with four electrodes, and two of the four electrodes can be connected, respectively, with two conductive lines of the second coil electrode 140.

The second lead electrode 141 can be positioned further inside than the first lead electrode 121. This means that a distance between the second lead electrode 141 and the middle of the first dielectric layer 122 is shorter than a distance between the first lead electrode 121 and the middle of the dielectric coating layer 111. Accordingly, the first lead electrode 121, the height compensation electrode 130 and the second lead electrode 141 form a stepped shape. Here, a cross-sectional area of the second lead electrode 141 can be the same as that of the first lead electrode 121.

The second dielectric layer 142 protects the second coil electrode 140 and insulates the second coil electrode 140 from the magnetic layer 160 formed on the second dielectric layer 142. The second dielectric layer 142 is formed on the first dielectric layer 122 so as to cover an upper surface of the second coil electrode 140 and an upper surface of the second lead electrode 141. The second dielectric layer 142 can be made of the same material as that of the first dielectric layer 122 and can be photosensitive.

The external electrode 150 functions as a path for electric current to flow in and out of the first coil electrode 120 and the second coil electrode 140. The external electrode 150 is formed on the second dielectric layer 142 so as to be electrically connected with the second lead electrode 141.

The external electrode 150 can be constituted with four electrodes, which can be electrically connected, respectively, with the four electrodes of the second lead electrode 141. The external electrode 150 can be placed at each of four corners on an upper surface of the second dielectric layer 142.

The magnetic layer 160 can be formed on the second dielectric layer 142 and can be made of a material in which magnetic powder and resin are mixed. While functioning to protect an inside of the common mode filter 100, the magnetic layer 160 can form a closed magnetic circuit together with the magnetic substrate 110 and enhance the ability to remove the common mode noise.

Meanwhile, as illustrated in FIG. 1, the common mode filter 100 in accordance with an embodiment of the present invention can further include a third coil electrode 170, a third lead electrode 171, a third dielectric layer 172, a fourth coil electrode 180, a fourth lead electrode 181 and a fourth dielectric layer 182.

Here, the third coil electrode 170, the third lead electrode 171 and the third dielectric layer 172 can correspond to the first coil electrode 120, the first lead electrode 121 and the first dielectric layer 122, respectively, and the fourth coil electrode 180, the fourth lead electrode 181 and the fourth dielectric layer 182 can correspond to the second coil electrode 140, the second lead electrode 141 and the second dielectric layer 142, respectively.

In other words, the common mode filter 100 can be provided to have a greater number of coil electrode layers by having the same configurations laminated repeatedly. Here, the height compensation electrode 130 can be interposed between the second lead electrode 141 and the third lead electrode 171 and between the third lead electrode 171 and the fourth lead electrode 181.

Accordingly, the first to fourth lead electrodes 121-181 can be electrically connected with one another by way of the height compensation electrode 130 and can take the stepped shape of ascending in one direction, as illustrated in FIG. 1. Moreover, if necessary, the direction of ascension can be different from layer to layer.

If there were no height compensation electrode, a positional difference between the lead electrode and the coil electrode on the upper-most layer would become greater with a greater number of coil electrode layers, thereby increasing the possibility of short-circuit.

However, by implementing the plurality of lead electrodes having the height compensation electrode interposed therein, the positional difference between the lead electrode and the coil electrode is overcome, making it possible to manufacture a multi-layer structure of common mode filter while inhibiting the short-circuit between the coil electrodes.

In the case where the common mode filter is small, the more coil electrode layers there are so as to extend the length of the coil electrode, the more advantageous it becomes to remove the common mode noise. Therefore, the common mode filter structure in accordance with an embodiment of the present invention can be effectively applied to a smaller common mode filter.

Hitherto, the common mode filter in accordance with an embodiment of the present invention has been described. Hereinafter, a method for manufacturing a common mode filter in accordance with an embodiment of the present invention will be described.

Figure 2:
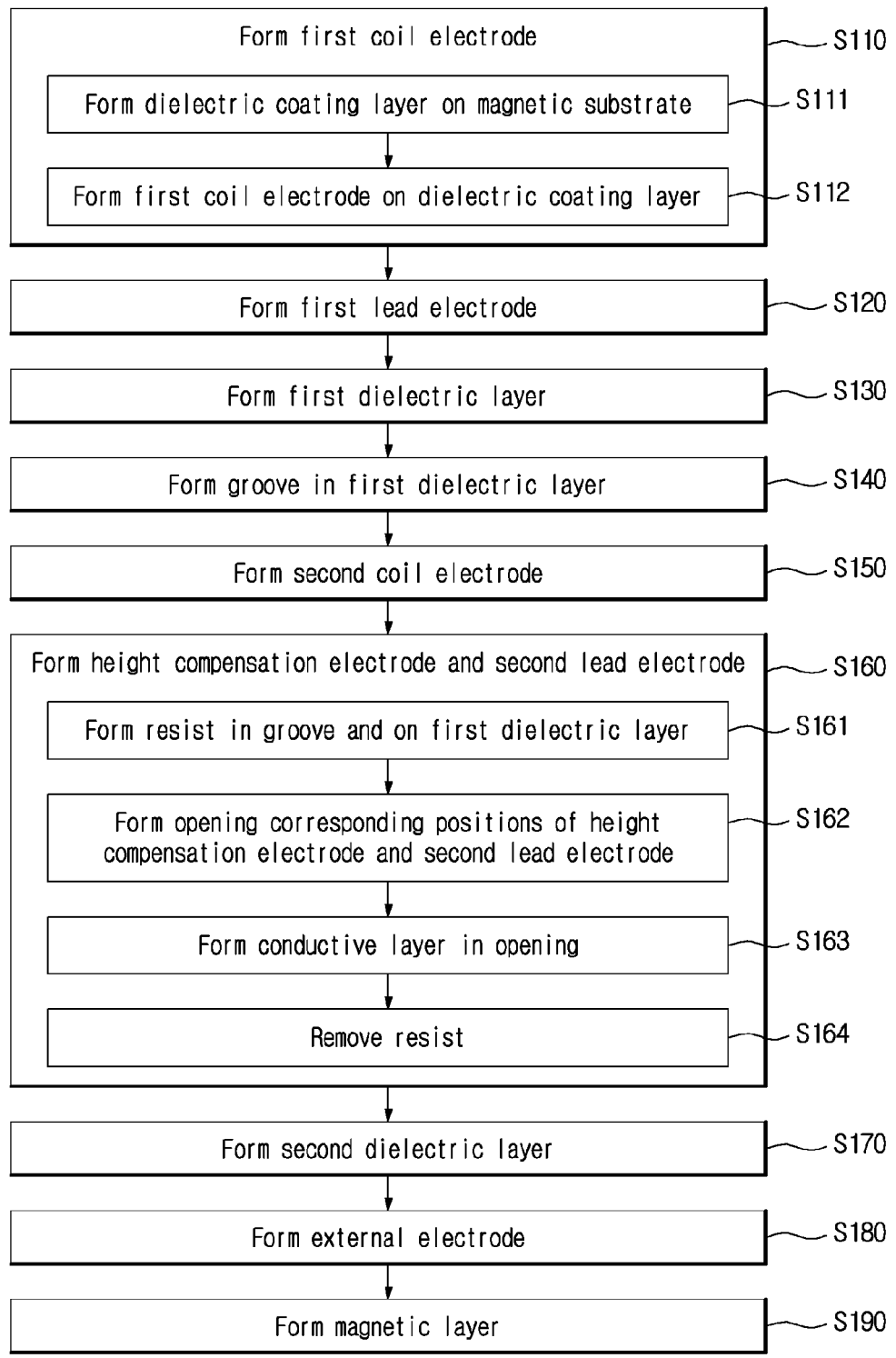
FIG. 2 is a flow diagram showing a method of manufacturing a common mode filter in accordance with an embodiment of the present invention.

FIG. 2 is a flow diagram showing a method of manufacturing a common mode filter in accordance with an embodiment of the present invention, and FIG. 3, FIG. 4, FIG. 5, FIG. 6, FIG. 7, FIG. 8, FIG. 9, FIG. 10, FIG. 11 and FIG. 12 show the flow of the method of manufacturing the common mode filter in accordance with an embodiment of the present invention.

Referring to FIG. 2, the method of manufacturing a common mode filter in accordance with an embodiment of the present invention can include: forming a first coil electrode (S110); forming a first lead electrode (S120); forming a first dielectric layer (S130); forming a groove in the first dielectric layer (S140); forming a second coil electrode (S150); forming a height compensation electrode and a second lead electrode (S160); forming a second dielectric layer (S170); forming an external electrode (S180); and forming a magnetic layer (S190).

Figure 3:
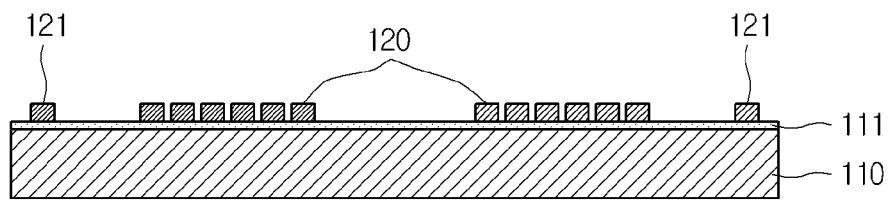
FIG. 3, FIG. 4, FIG. 5, FIG. 6, FIG. 7, FIG. 8, FIG. 9, FIG. 10, FIG. 11 and FIG. 12 show the flow of the method of manufacturing the common mode filter in accordance with an embodiment of the present invention.

Referring to FIG. 3, in the step of forming a first coil electrode (S110), a first coil electrode 120 is formed on a magnetic substrate 110. The step of forming the first coil electrode 120 (S110) can include forming a dielectric coating layer 111 on the magnetic substrate 110 (S111) and forming the first coil electrode 120 on the dielectric coating layer 111 (S112). The dielectric coating layer 111 functions to insulate the first coil electrode 120 from the magnetic substrate 110, as described above.

In the step of forming a first lead electrode (S120), a first lead electrode 121, which is connected with an end of the first coil electrode 120, is formed on the magnetic substrate 110, wherein the first lead electrode 121 can be formed on an upper surface of the dielectric coating layer 111. Here, the first coil electrode 120 and the first lead electrode 121 can be formed with a same conductive material through photolithography.

Figure 4:
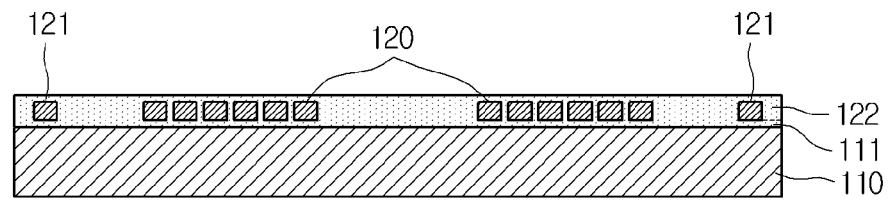

Referring to FIG. 4, in the step of forming a first dielectric layer (S130), a first dielectric layer 122, which covers an upper surface of the first coil electrode 120 and an upper surface of the first lead electrode 121, is formed. The first dielectric layer 122 can cover the entire upper surface of the first coil electrode 120 and the entire upper surface of the first lead electrode 121. The first dielectric layer 122 can be a photosensitive material.

Figure 5:
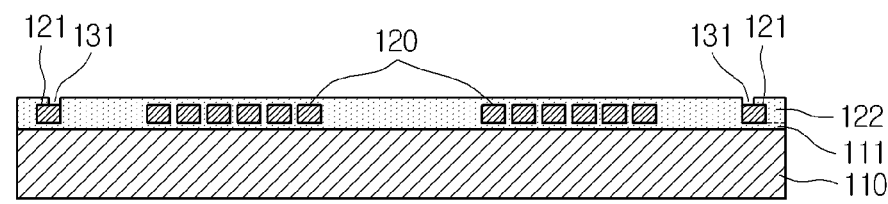

Referring to FIG. 5, in the step of forming a groove in the first dielectric layer (S140), a groove 131 is formed in the first dielectric layer 122 in order to expose the first lead electrode 121. In the case where the first dielectric layer 122 is a photosensitive material, the groove 131 can be formed through exposure and development processes. A cross-sectional area of the groove 131 can be the same as or smaller than that of the first lead electrode 121.

In the step of forming a second coil electrode (S150), a second coil electrode 140, which is electrically connected with the first coil electrode 120, is formed on the first dielectric layer 122.

In the step of forming a height compensation electrode and a second lead electrode (S160), a height compensation electrode 130, which is for compensating for a difference in height between the first dielectric layer 122 and the first lead electrode 121, and a second lead electrode 141, which is connected with an end of the second coil electrode 140, are formed. A cross-sectional area of the second lead electrode 141 can be the same as that of the first lead electrode 121, and a cross-sectional area of the height compensation electrode 130 can be smaller than that of the first lead electrode 121.

While the height compensation electrode 130 and the second lead electrode 141 can be separately produced, it is possible that the height compensation electrode 130 and the second lead electrode 141 are integrally produced, in which case the manufacturing process can be simplified.

The step of forming the height compensation electrode 130 and the second lead electrode 141 (S160) can include: forming a resist 131 in the groove 131 and on the first dielectric layer 122 (S161); forming an opening 133 corresponding to positions of the height compensation electrode 130 and the second lead electrode 141 (S162); forming a conductive layer 134 in the opening 133 (S163); and removing the resist 132 (S164).

Figure 6:
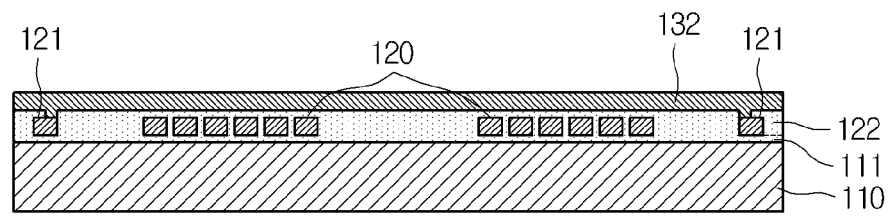

Referring to FIG. 6, in the step of forming the resist 132 in the groove 131 and on the first dielectric layer 122 (S161), the resist 132 is formed on a surface of the first dielectric layer 122 in such a way that the groove 131 formed in the first dielectric layer 122 is filled with the resist 132 therein. Here, the resist 132 is a photosensitive material.

Figure 7:
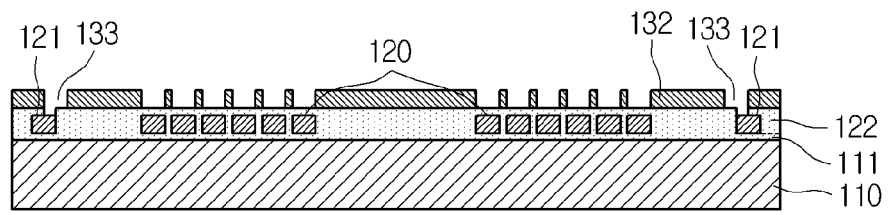

Referring to FIG. 7, in the step of forming the opening 133 corresponding to positions of the height compensation electrode 130 and the second lead electrode 141 (S162), the opening 133 is formed throughout the first lead electrode 121 and the first dielectric layer 122. For example, the opening 133 having a same cross-sectional area as that of the first lead electrode 121 can be formed to be misaligned with the first lead electrode 121.

Figure 8:
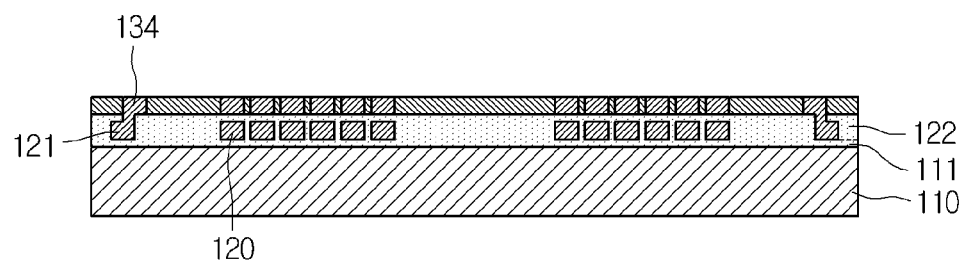

Referring to FIG. 8, in the step of forming the conductive layer 134 in the opening 133 (S163), the conductive layer 134, which functions as the height compensation electrode 130 and the second lead electrode 141, is formed in the opening 133. That is, a thickness of the conductive layer 134 corresponding to the difference in height between the first dielectric layer 122 and the first coil electrode 120 functions as the height compensation electrode 130, and the remaining thickness of the conductive layer 134 functions as the second lead electrode 141.

The conductive layer 134 can be formed by use of plating. In such a case, a seed layer can be formed on the first dielectric layer 122 prior to forming the resist 132, and the conductive layer 134 can be plated by taking the seed layer as a seed.

Figure 9:
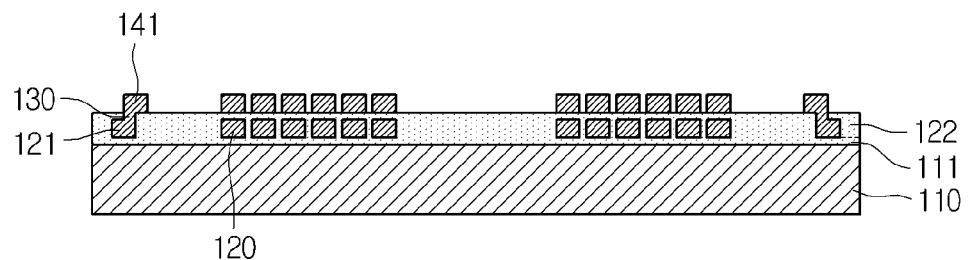

Referring to FIG. 9, in the step of removing the resist 132 (S164), the unnecessary resist 132 is peeled off. In the case where the conductive layer 134 is formed by plating, the seed layer that is exposed can be removed after removing the resist 132.

Although it is illustrated in FIG. 9 that the second lead electrode 141 has a uniform thickness, the second lead electrode 141 may be thicker near the groove 131 than away from the groove 131, in case where the conductive layer 134 is formed by plating. Assuming that the plating is made in a uniform thickness, since the second lead electrode 141 is plated simultaneously with the height compensation electrode 130, the portion of the second lead electrode 141 above the groove 131 becomes thinner because the height compensation electrode 130 is plated.

Nevertheless, since a height of the second lead electrode 141 placed on an upper surface of the first dielectric layer 122 can be the same as that of the second coil electrode 140, short-circuit is not occurred.

Meanwhile, referring to FIG. 6 to FIG. 9, the second coil electrode 140 can be formed simultaneously with the second lead electrode 141 and the height compensation electrode 130. In the case where the photosensitive resist 132 is used as described above, the second coil electrode 140, the second lead electrode 141 and the height compensation electrode 130 can be made of a same conductive material and formed simultaneously.

The second lead electrode 141 can be positioned further inside than the first lead electrode 121, which can be formed near corners on the magnetic substrate 110. In other words, the first lead electrode 121 can be placed near corners on the upper surface of the dielectric coating layer 111. In such a case, the first lead electrode 121, the height compensation electrode 130 and the second lead electrode 141 can form a stepped shape.

Figure 10:
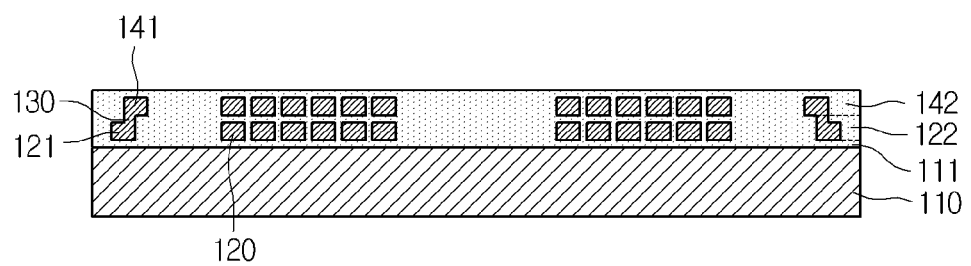

Referring to FIG. 10, in the step of forming a second dielectric layer (S170), a second dielectric layer 142, which covers an upper surface of the second coil electrode 140 and an upper surface of the second lead electrode 141, is formed on the first dielectric layer 122.

Figure 11:
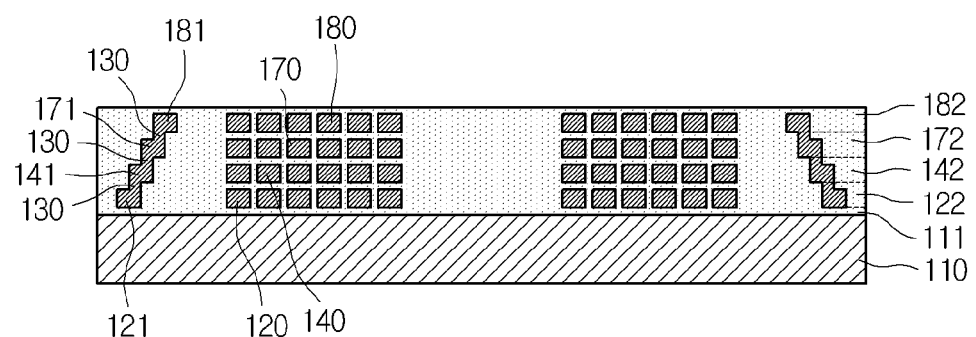

Meanwhile, as illustrated in FIG. 11, by repeating the above procedures, a third coil electrode 170, a third lead electrode 171, a third dielectric layer 172, a fourth coil electrode 180, a fourth lead electrode 181 and a fourth dielectric layer 182 can be further formed.

Here, the third coil electrode 170, the third lead electrode 171 and the third dielectric layer 172 can correspond to the first coil electrode 120, the first lead electrode 121 and the first dielectric layer 122, respectively, and the fourth coil electrode 180, the fourth lead electrode 181 and the fourth dielectric layer 182 can correspond to the second coil electrode 140, the second lead electrode 141 and the second dielectric layer 142, respectively.

Figure 12:
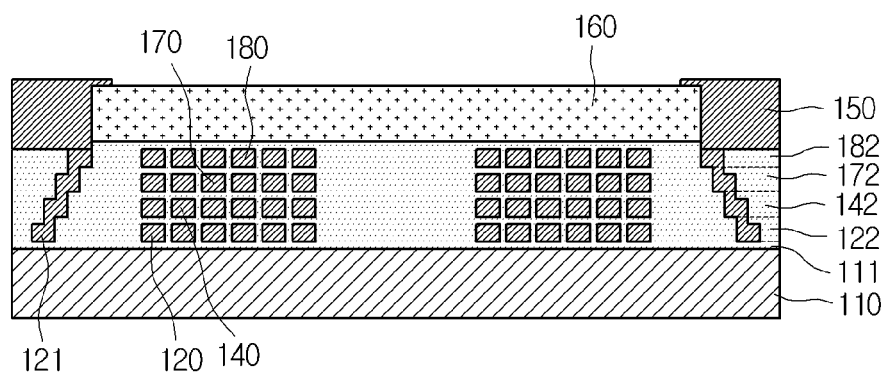

Referring to FIG. 12, in the step of forming an external electrode (S180), an external electrode 150, which is electrically connected with the second lead electrode 141 to function as a path for allowing electric current to flow in and out of the first coil electrode 120 and the second coil electrode 140, is formed on the second dielectric layer 142.

The external electrode 150 can be in direct contact with the second lead electrode 141, for which the second lead electrode 141 needs to be exposed by removing a portion of the second dielectric layer 142. In the case where the second dielectric layer 142 is a photosensitive material, the second lead electrode 141 can be exposed through photolithography.

Moreover, as illustrated in FIG. 11, the external electrode 150 can be connected with the second lead electrode 141 by way of the third lead electrode 171 and the fourth lead electrode 181.

In the step of forming a magnetic layer (S190), a magnetic layer 160, which is made of a material having magnetic powder and resin mixed therein, is formed on the second dielectric layer 142. Together with the magnetic substrate 110, the magnetic layer 160 can enhance the ability of the common mode filter 100 for removing the common mode noise.

As described above, according to the method of manufacturing a common mode filter in accordance with an embodiment of the present invention, a common mode filter that can prevent short-circuit can be provided through simple manufacturing procedures.

Although certain embodiments of the present invention have been described, it shall be appreciated that there can be a very large number of permutations and modification of the present invention by those who are ordinarily skilled in the art to which the present invention pertains without departing from the technical ideas and scope of the present invention, which shall be defined by the claims appended below.

It shall be also appreciated that many other embodiments than the embodiments described above are included in the claims of the present invention.

What is claimed is:

1. A common mode filter comprising:
   a magnetic substrate;
   a first coil electrode formed on the magnetic substrate;
   a first lead electrode formed on the magnetic substrate so as to be connected with an end of the first coil electrode;
   a first dielectric layer formed on the magnetic substrate so as to cover an upper surface of the first coil electrode and an upper surface of the first lead electrode;
   a height compensation electrode formed on the upper surface of the first lead electrode in order to compensate for a difference in height between the first dielectric layer and the first lead electrode;
   a second coil electrode formed on the first dielectric layer so as to be electrically connected with the first coil electrode;
   a second lead electrode formed on the first dielectric layer so as to be connected with an end of the second coil electrode and to be in contact with an upper surface of the height compensation electrode;
   a second dielectric layer formed on the first dielectric layer so as to cover an upper surface of the second coil electrode and an upper surface of the second lead electrode; and
   an external electrode formed on the second dielectric layer so as to be electrically connected with the second lead electrode,
   wherein the second lead electrode is positioned further inside the common mode filter than the first lead electrode, such that the second lead electrode is disposed closer to the center of the common mode filter in a horizontal direction than the first lead electrode.

2. The common mode filter of claim 1, wherein the first dielectric layer has a groove formed therein so as to allow the first lead electrode to be exposed, and the height compensation electrode is formed in the groove.

3. The common mode filter of claim 1, wherein the height compensation electrode and the second lead electrode are integrally formed.

4. The common mode filter of claim 1, wherein a cross-sectional area of the height compensation electrode is smaller than that of the first lead electrode.

5. The common mode filter of claim 1, further comprising a dielectric coating layer interposed between the magnetic substrate and the first dielectric layer.

6. The common mode filter of claim 1, wherein the first lead electrode is arranged near corners of the magnetic substrate.

7. The common mode filter of claim 1, further comprising a magnetic layer formed on the second dielectric layer.

* * * * *